United States Patent [19]

Schlup et al.

[11] 4,127,936
[45] Dec. 5, 1978

[54] DEVICE FOR ASSEMBLING ELECTRONIC COMPONENTS ON A PRINTED CIRCUIT BOARD

[75] Inventors: Gustave E. Schlup, Longeau-prés-Bienne; Edwin Berger, Port, both of Switzerland

[73] Assignee: G. E. Schlup & Co., Berne, Switzerland

[21] Appl. No.: 784,185

[22] Filed: Apr. 4, 1977

[30] Foreign Application Priority Data

Apr. 2, 1976 [CH] Switzerland .................. 4122/76

[51] Int. Cl.² ................... B23P 19/04; B23P 21/00
[52] U.S. Cl. ................................ 29/721; 29/407; 29/739
[58] Field of Search ............ 29/720, 721, 739, 741, 29/625, 626, 407

[56] References Cited

U.S. PATENT DOCUMENTS

| 3,372,455 | 3/1968 | Howie | 29/721 |
|---|---|---|---|
| 3,548,493 | 12/1970 | Hubbard | 29/741 |
| 3,611,544 | 10/1971 | Frels et al. | 29/741 |
| 3,705,347 | 12/1972 | Tuller | 29/720 |
| 3,710,477 | 1/1973 | Frawley | 29/721 |
| 3,731,363 | 5/1973 | Hall et al. | 29/721 |
| 3,852,865 | 12/1974 | Ragard | 29/720 |
| 3,992,772 | 11/1976 | Scannell et al. | 29/739 |

*Primary Examiner*—Lowell A. Larson
*Assistant Examiner*—Daniel C. Crane
*Attorney, Agent, or Firm*—Silverman, Cass & Singer, Ltd.

[57] ABSTRACT

A device for fitting electronic components and their respective connecting leads into the proper holes in a circuit board. The device includes an illuminating matrix with a grid size small enough to illuminate any desired hole in the printed circuit board, which matrix is mounted on a carriage movable with respect to the circuit board. The matrix is movable along the length of the carriage such that the holes in the illuminating matrix may be selectively illuminated after the carriage and matrix are moved to align the matrix holes with the desired printed circuit board holes.

3 Claims, 5 Drawing Figures

DEVICE FOR ASSEMBLING ELECTRONIC COMPONENTS ON A PRINTED CIRCUIT BOARD

The present invention concerns a device for fitting the appropriate electronic components on a printed circuit board by means of illuminating the holes of the printed circuit board being assembled in which the connections of the components must be inserted. The operator is thereby shown the holes into which a given electronic component must be placed.

In devices of the above-mentioned type, illumination of the holes of the printed circuit board is normally ensured by laying a second, identical board beneath the first, with one end of optical light guides placed in its holes. The other end of the light guide is illuminated by a powerful lamp, which therefore lights the corresponding holes.

The objective of the present invention consists in replacing this second printed circuit board by a flexible system of illumination, which permits the sequence of holes to be illuminated to be determined automatically with a program control unit.

For this reason the device invented is specially distinguished in that the illumination of the holes in the printed circuit board being assembled is accomplished by means of a carriage, which can be moved to any desired position beneath the printed circuit board and is provided with an illuminating matrix with holes passing through in a sufficiently fine grid for the holes of the upper printed circuit board to coincide with these holes in the illuminating matrix, and that one end of optical light guides are placed in these holes passing through, with the other ends illuminated by a source of light, in such a way that those light guides illuminated direct the light through the matrix to the printed circuit board above and there illuminate the holes of the printed circuit board lying directly above the illuminated holes passing through the illuminating matrix.

The subject of the invention is described more fully below with reference to the drawings.

The device illustrated comprises a table 1 on which a swivelling container is mounted below a cover 2 with only one opening 3. This swivelling container is divided into compartments for holding various electronic components such as (capacitors, resistors, transistors, etc. as component 4 in FIG. 3), and is so supported that it can be turned in steps forwards or backwards to enable the individual compartments to be set directly below the opening 3 of cover 2 with only one compartment directly accessible at any time.

Figure 1:
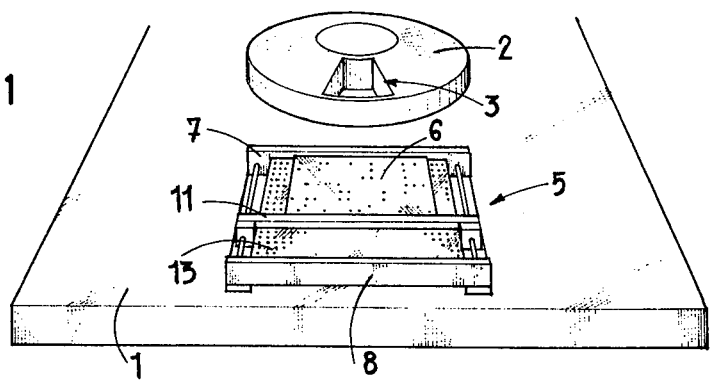
FIG. 1 is a perspective drawing of part of a device for assembling printed circuit boards.
Figure 2:
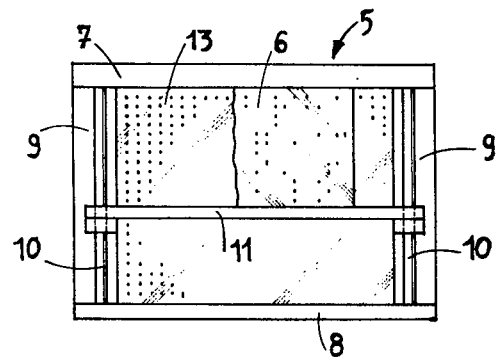
FIG. 2 is a plan view of a part of this device to a larger scale.

The device further incorporates a frame, shown roughly by 5 in FIG. 2, for fixing the printed circuit board to be assembled. This frame consists of two end pieces 7 and 8, which are secured by two connecting pieces 9. Two bars 10 are fixed over these connecting pieces 9 to act as slide rails for a securing bar 11 mounted parallel to the end pieces 7 and 8, and therefore allow a printed circuit board of any size 6 to be fixed between this securing bar 11 and the end piece 7.

Figure 3:
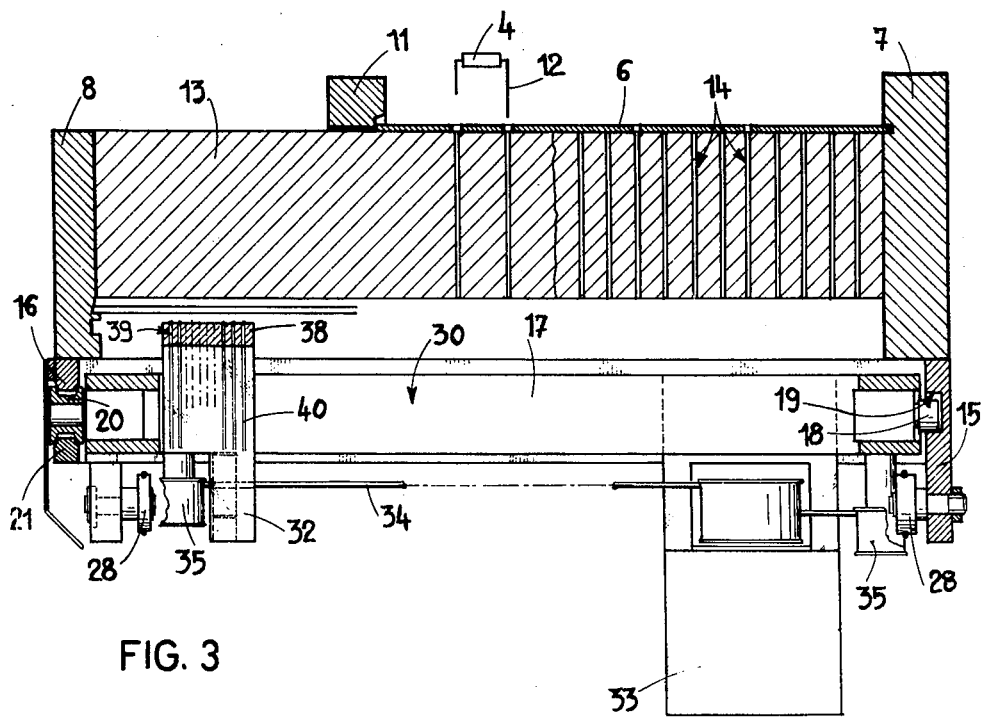
FIG. 3 is a section through the device to a much larger scale.

To permit the attachment of electronic components 4, of which the connecting wires 12 have not previously been shortened, in the printed circuit board 6, a relatively thick plastic sheet 13 is fixed beneath the printed circuit board 6 between the end pieces 7 and 8 of frame 5. The sheet 13 is provided with a number of holes passing through 14 (FIGS. 2 and 3) of which only some are shown in FIG. 3. These holes form a horizontal and vertical grid system as shown in FIG. 2. They have a diameter of approx. 1.5 mm and are so close together (e.g. in a 2.54 mm grid) that the holes of the printed circuit board 6 must coincide with one or another of these holes 14. When an electronic component 4 is inserted in a printed circuit board 6, the unshortened connecting wires 12 of the component have sufficient space in these holes 14 of sheet 13 to prevent them being damaged.

Figure 4:
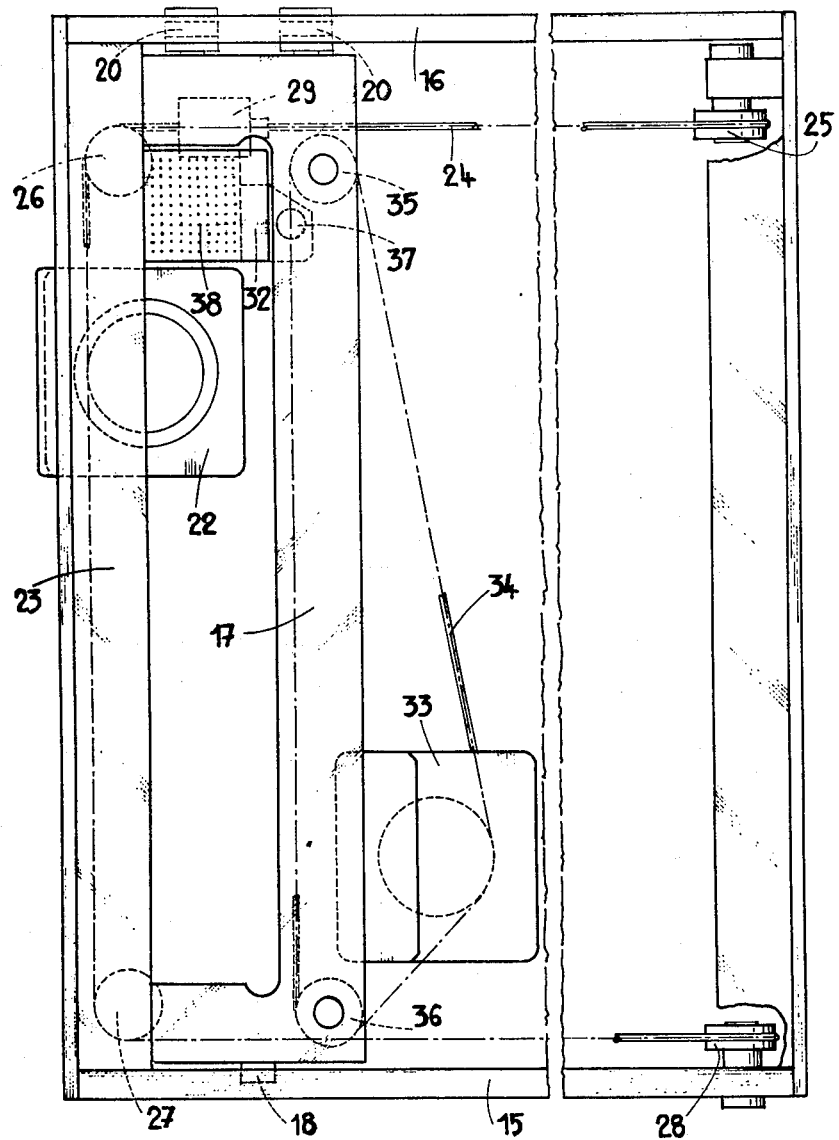
FIG. 4 is a plan view on the same scale as FIG. 3.

Two guide rails 15 and 16 are fitted beneath the ends 7 and 8 of frame 5, along which a transverse panel 17 slides. This transverse panel has a friction bearing 18 at one end located in the longitudinal groove 19 of the guide rail 15 and two friction bearings 20 at the other end, located between guide rail 16 and a check rail 21. An electrical stepping motor 22 (FIG. 4) fitted between the guide rails 15 and 16 with a fixed crossbar moves the mobile transverse panel 17 to and fro by means of a flexible cord 24. This cord is attached to the moving transverse panel 17 with intermediate piece 29 via the guide rollers 25, 26, 27 and 28.

Figure 5:
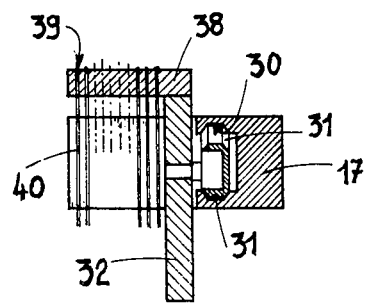
FIG. 5 is a section through V—V in FIG. 4.

There is a groove 30 (FIG. 5) along the moving transverse panel 17 containing the three friction bearings 31 (FIG. 5), only two can be seen on the drawing, of the carriage 32. The two outer bearings slide along the lower edge of the groove, while the centre bearing slides along the upper edge. An electrical stepping motor 33 is also fitted on the moving transverse panel which moves the carriage 32 to and fro by means of another cord 34 along the moving transverse panel. This cord is attached to the intermediate piece 37 of the carriage 32 via guide rollers 35 and 36.

An illuminating matrix 38 with holes 39 passing through is fitted on the carriage 32. These holes are arranged in exactly the same horizontal and vertical sequence as the holes 14 of the plastic sheet 13, so that the holes 39 of the illuminating matrix 38 coincide at every position of the carriage 32 with the holes 14 passing through the plastic sheet 13. One end of an optical guide 40, made from drawn glass and with the ability to direct light, is placed in each of the holes 39 of the illuminating matrix 38. The other end of these optical light guides is selectively illuminated by a source of light not shown in the attached drawings.

The present device enables all the holes of a printed circuit board to be selectively illuminated. The carriage 32, and consequently also the illuminating matrix 38, scan the horizontal direction of the printed circuit board 6 by moving the carriage along the transverse panel 17, while the vertical direction of printed circuit board 6 is scanned by the movement of the entire transverse panel 17. The device described and illustrated can be controlled electronically with the aid of programs. An appropriate program can be prepared for every printed circuit board to be assembled, which brings the swivelling container with compartments of electronic components to the opening 3 of cover 2 in the correct sequence, so that only one type of component is accessible at any time, and also brings the illuminating matrix 38 to the appropriate position beneath the printed circuit board 6, to enable the corresponding holes to be illuminated which must accept the connecting wires of the component.

We claim:

1. A device for fitting electronic components and their connecting leads onto printed circuit boards of a first size, by illuminating the respective holes in the circuit boards through which the respective component leads are to be inserted, said device comprising:

means for mounting at least one circuit board in a first plane;

illuminating matrix means of a second size less than said first size and including a grid of holes having a spacing therebetween at least as close as the closest pair of holes on said circuit board into which said component leads are to be inserted;

carriage means having said matrix means mounted thereon and movable to align selected holes of said illuminating matrix means with respective holes of said printed circuit board into which said leads are to be inserted;

illuminating means for illuminating said selected holes of said illuminating matrix means and said respective holes of said printed circuit board;

said carriage means is movable in a second plane substantially parallel to said first plane in a first direction relative to said printed circuit board; and said matrix means being movable on said carriage means in a second direction perpendicular to said first direction.

2. A device as claimed in claim 1 further including:

a swiveling container divided into compartments for holding said electronic components, only one compartment being accessible at any one position, and means linking the position of said illuminating matrix means and said swiveling container such that the respective holes of the printed circuit board which are illuminated are those which accept the electronic component from the compartment accessible at that time.

3. A device according to claim 1 wherein said means for mounting include:

sheet means of a third size greater than said first size including a matrix of holes therethrough having a grid corresponding with said grid of said illuminating matrix means onto which said printed circuit board is mounted and of a thickness such that said connecting leads may be inserted into said holes of said sheet means through said printed circuit board.

* * * * *